(12) United States Patent
Ueno

(10) Patent No.: US 6,407,592 B2
(45) Date of Patent: Jun. 18, 2002

(54) SAMPLE-AND-HOLD CIRCUIT

(75) Inventor: Masayuki Ueno, Tokyo (JP)

(73) Assignee: Kawasaki Microelectronics, Inc., Chiba (JP)

( * ) Notice: Subject to any disclaimer, the term of this patent is extended or adjusted under 35 U.S.C. 154(b) by 0 days.

(21) Appl. No.: 09/819,616

(22) Filed: Mar. 29, 2001

(30) Foreign Application Priority Data

Mar. 29, 2000 (JP) .................................. 2000-090450

(51) Int. Cl.[7] .................... G11C 27/02; H03K 17/16
(52) U.S. Cl. .................... 327/95; 327/96; 341/122
(58) Field of Search ........................ 327/91, 94, 95, 327/96; 341/122

(56) References Cited

U.S. PATENT DOCUMENTS

| | | | | |
|---|---|---|---|---|
| 4,922,130 A | * | 5/1990 | Swerlein | 327/94 |
| 5,148,054 A | * | 9/1992 | Demler | 327/91 |
| 5,481,212 A | * | 1/1996 | Shima | 327/94 |
| 5,612,698 A | * | 3/1997 | Reay | 341/167 |
| 6,040,732 A | * | 3/2000 | Brokaw | 327/408 |
| 6,281,762 B1 | * | 8/2001 | Nakao et al. | 327/308 |

* cited by examiner

Primary Examiner—Timothy P. Callahan
Assistant Examiner—Terry L. Englund
(74) Attorney, Agent, or Firm—Oliff & Berridge, PLC

(57) ABSTRACT

The charge stored in a hold capacitor is prevented from leaking via the switches connected to the electrode of the capacitor, in a sample-and-hold circuit, and the reduction in the voltage held in the capacitor is suppressed, thereby improving the performance of the sample-and-hold circuit. The switches connected to the capacitor comprises two N-channel MOS transistors that are connected in series and are simultaneously turned on or off. During the period that the switches are in the OFF state, the potential at the interconnection node of the two transistors (one end of a first transistor) is set so as to be equal to that of the other end of the first transistor. Since the potential difference between both ends of the first transistor thereby becomes zero, leakage currents via the first transistor is reduced, and charge leakage in the capacitor can be prevented.

10 Claims, 8 Drawing Sheets

SAMPLE-AND-HOLD CIRCUIT

BACKGROUND OF THE INVENTION

1. Field of the Invention

The present invention relates to a sample-and-hold circuit that stores the electric charge corresponding to an input voltage in a capacitor, and holds the potential thereof, and particularly to a sample-and-hold circuit that reduces the charge leakage due to the switches connected to the electrode of the capacitor, and suppresses the reduction in the held voltage.

2. Description of the Related Art

FIG. 4 is a circuit diagram for a capacitor array type D/A conversion circuit using a conventional sample-and-hold circuit.

This sample-and-hold circuit stores the charge corresponding to the voltage input from an input terminal VR in a capacitor C3, and holds the potential thereof. The held potential is amplified by an amplifier 10 connected to the capacitor C3, and the amplified voltage is output from an output terminal Vout to the outside.

The capacitor that stores the charge corresponding to the voltage input from the outside and holds the potential thereof is referred to as a "hold capacitor".

The operation of this conventional capacitor array type D/A conversion circuit will be described below. First, for initialization (reset), all of the one ends of the capacitors C0 to C2 are connected to the ground GND by switches SW0 to SW2, and a N-channel MOS transistor TN1 is turned on. Then, the amount of the charges which have been stored in the capacitors C0 to C3 becomes zero.

Next, in response to the digital signals input as signals to be D/A converted, one ends of the capacitors C0 to C2 are connected to a reference voltage terminal VR by the SW0 to SW2 switches, and then a N-channel MOS transistor TN1 is turned off. Here, for example, when one end of the capacitor C0 is connected to the ground GND by the switch SW0, the one ends of the capacitors C1 and C2 are connected to a reference voltage terminal VR by the switches SW1 and SW2, and the N-channel MOS transistor TN1 is turned off, a voltage output from the output terminal Vout is given by the following equation.

$$Vout=(Q3/C3)=\{(C1+C2)/C3\} \times VR \qquad (1)$$

where, C1 to C3 denotes the capacitances of the capacitors C1 to C3, respectively, and Q3 denotes the amount of the charge stored between both ends of the capacitor C3.

FIG. 5 is a circuit diagram for a switching comparator using a sample-and-hold circuit in accordance with another conventional example.

In FIG. 5, a sample-and-hold circuit is comprised of a capacitor C4, an inverter I1, and a N-channel MOS transistor TN3. By adding N-channel MOS transistors TN2 and TN4 to such a sample-and-hold circuit, a switching comparator is formed.

The operation of the switching comparator shown in FIG. 5 will be described using a timing chart shown in FIG. 6.

First, in a time period T1, the N-channel MOS transistors TN2 and TN3 are turned on, and the N-channel MOS transistor TN4 is turned off. The capacitor C4 is thereby initialized while an input voltage V1 is applied.

Then, in a time period T2, the N-channel MOS transistors TN2 and TN3 are turned off, and the N-channel MOS transistor TN4 is turned on. As a result, the output of the inverter I1 varies in response to the potential difference between the input voltage V1 and an input voltage V2. If V1 is larger than V2, an "H" level, that is, a power supply voltage VDD is output from the inverter I1. On the other hand, if V1 is smaller than V2, an "L" level, that is, a GND level is output from the inverter I1. In this way, the switching comparator compares magnitudes between input voltages V1 and V2, and outputs an "H" level or an "L" level.

Hereafter, after the time period T3, similar operations to the above-described time periods T1 and T2 are repeated.

FIG. 7 is a circuit diagram for a successive comparison type A/D conversion circuit using the above-described switching comparator.

In this A/D conversion circuit, each of N-channel MOS transistors TN11, TN12, TN13, etc. corresponds to the N-channel MOS transistor TN4 of the above-described switching comparator. The connection nodes in a ladder resistor comprising a plurality of resistors R are connected to the plurality of N-channel MOS transistors TN11, TN12, TN13 etc. Each of the plurality of N-channel MOS transistors selectively selects the voltage produced by the ladder resistor. Herein, a capacitor C4 stores the charge given by the following equation.

$$Q=C4 \times (Vin-Vb) \qquad (2)$$

where, Vb denotes the input voltage of the inverter I1 when the capacitor C4 has been initialized.

The operation of the A/D conversion circuit shown in FIG. 7 will be described using a timing chart shown in FIG. 8.

First, in a time period T0, the N-channel MOS transistors TN2 and TN3 are turned on, and all of the N-channel MOS transistors TN11, TN12, TN13, etc. are turned off. The capacitor C4 is thereby initialized while an analog signal Vin to be A/D converted is applied to.

Then, in a time period T1, the N-channel MOS transistors TN2 and TN3 are turned off, and the N-channel MOS transistor TN11 is turned on. As a result, the output of the inverter I1 varies in response to the potential difference between the input voltage Vin and a reference voltage VR1. If VR1 is smaller than Vin, an "H" level is output from the inverter I1. On the other hand, if VR1 is larger than Vin, an "L" level is output. In this manner, the switching comparator compares magnitudes between the input voltage Vin and the reference voltage VR1, and outputs an "H" level or an "L" level.

Next, in a time period T2, the N-channel MOS transistors TN2 and TN3 are turned off, and the N-channel MOS transistor TN12 is turned on. As a result, the output of the inverter I1 varies in response to the potential difference between the input voltage Vin and a reference voltage VR2. If VR2 is smaller than Vin, an "H" level is output from the inverter I1. On the other hand, if VR2 is larger than Vin, an "L" level is output. The switching comparator thus compares magnitudes between an input voltage Vin and the reference voltage VR2, and outputs an "H" level or an "L" level.

The same operation is performed for each time period after a time period T3. N-channel MOS transistors from a N-channel MOS transistor TN13 onward are successively turned on, reference voltages from a voltage VR3 onward are successively input, and reference voltages are successively compared with the input voltage Vin.

FIG. 9 is a circuit diagram for a sample-and-hold circuit in accordance with a third conventional example.

In this sample-and-hold circuit, the voltage input from an input terminal Vin is amplified by an amplifier 11, and the amplified voltage is output from an output terminal Vout.

Also, the charge corresponding to the voltage input from the input terminal Vin is stored in a capacitor C5, and the potential is held by turning off a N-channel MOS transistor TN5. Even after the N-channel MOS transistor TN5 has been turned off, the held potential continues to be output.

In this manner, in each of these first to third conventional examples, the charge corresponding to the voltage input from the outside is stored in the capacitor, and thereby the potential thereof is held. However, even if the switches connected to the capacitor are turned off, the charge stored in the capacitor leaks as leakage currents via the switches.

Specifically, for example, in the first conventional example shown in FIG. 4, even if the N-channel MOS transistor that constitutes a switch is in the OFF state with its gate voltage being 0V, the charge stored in the capacitor C3 leaks as leakage currents via the N-channel MOS transistor TN1. Likewise, in the second conventional example shown in FIG. 5, the charge stored in the capacitor C4 leaks as leakage currents via the N-channel MOS transistor TN3 that is in the OFF state, and in the third conventional example shown in FIG. 9, the charge stored in the capacitor C5 leaks as leakage currents via the N-channel MOS transistor TN5 that is in the OFF state.

FIG. 10 is a diagram illustrating the leakage of the charge stored in the hold capacitor in the first conventional example.

In this diagram, the time period A is an initialization period that the charge is discharged and the next charge storage is prepared for. The time period B is a time period that the charge is stored and the potential is held, as well as the voltage output to the outside. Herein, the charge stored in the hold capacitor leaks as leakage currents via the switches connected thereto, and decreases with time. As shown in FIG. 10, for example, the amounts corresponding to charge amounts q1 or q2 become the loss portions due to the leakage currents flowing via the switches. Here, the difference in the amount of charge loss between q1 and q2 is attributable to the difference in the characteristics between transistors constituting the switches.

In this way, as the charge decreases, the held voltage also declines.

In the first conventional example, under ideal conditions that there is no leakage current, a voltage based on the above-described equation (1) is output. However, as shown in FIG. 10, when the charge Q3 stored in the capacitor C3 decreases, an intended voltage Vout cannot be achieved. The difference between the intended voltage and the voltage actually obtained corresponds to the above-described amounts of the charge losses q1 and q2.

Here, in order to speed up circuit operations, if the capacity of the hold capacitor is reduced and/or the on-resistances of the switches connected to the capacitor is decreased, such influences of leakage currents increase. Also, appropriate comparative operations in an A/D conversion and the like cannot be carried out when attempting to elongate a voltage output period.

To the contrary, in order to perform appropriate comparative operations, it is necessary to increase the capacity of the hold capacitor, and/or to increase the on-resistances of the switches. However, this, in turn, prevents an initialization operation from being appropriately achieved. That is, it takes longer time than necessary to discharge the charge stored in the hold capacitor, and/or to store enough charge in the hold capacitor up to the voltage input from the outside.

Thus, in the conventional sample-and-hold circuits, the avoidance of the influences of leakage currents, and the achievement of a desired accuracy are gained at the expense of operation speed.

SUMMARY OF THE INVENTION

The present invention has been made with a view to solving the above-described problems associated with the conventional art. The purpose of the present invention is to prevent the electric charge stored in a hold capacitor from leaking as leakage currents via the switches connected to the hold capacitor, to suppress the reduction of the voltage held in the hold capacitor, and to thereby improve the performance of the sample-and-hold circuit.

In order to achieve the above-described purpose, the present invention provides a sample-and-hold circuit that has a capacitor for storing the voltage input from the outside as an electric charge, and holding the potential thereof, and has the switches connected to the capacitor. The switches are constituted of a plurality of switches that are connected in series with each other. In this sample-and-hold circuit, the potential difference between both ends of the switch (referred to as a first switch or the input terminal side switch) connected to the side of the capacitor out of the plurality of switches, is set to zero or substantially zero, at least during the time period that the plurality of switches is in the OFF state.

Preferably, the plurality of switches are connected in series with each other, and is simultaneously turned on or off.

Also, preferably the first switch is connected to one electrode (referred to as a charge storage electrode) in which a charge is stored, out of both electrodes of the capacitor. Here, the other electrode (opposite electrode to the charge storage electrode) of the capacitor is provided with a predetermined potential.

Furthermore, it is preferable that the sample-and-hold circuit in accordance with the present invention further includes an equipotential setting circuit that sets the potential of one end of the first switch wherein the other end thereof is connected to the capacitor so that the potential difference between both ends of the switch becomes zero or substantially zero.

Also, preferably, each of the plurality of switches or the hold capacitor is formed of a MOS transistor.

Moreover, it is preferable that the equipotential setting circuit includes a differential amplifier having a first input terminal, a second input terminal, and an output terminal for outputting the voltage obtained by amplifying the potential difference between the first and second input terminals, and includes a switch (second switch) for connecting the interconnection node of the plurality of switches and the first input terminal. In this equipotential setting circuit, it is further preferable that one end of the capacitor is connected to the second input terminal, while the other end thereof is connected to the output terminal, and that the interconnection node of the plurality of switches and the first input terminal is connected by the second switch, during the time period that the plurality of switches is in the OFF state.

In addition, the equipotential setting circuit preferably has a buffer amplifier that amplifies the voltage at the interconnection node between one end of the capacitor and the input terminal of the amplifier, outputs the amplified voltage to the output terminal thereof, and has an amplification factor of "1", and preferably has a switch that connects the interconnection node of these switches and the output terminal of the buffer amplifier, during the time period that these plurality of switches is in the OFF state.

The above and other objects, features, and advantages of the present invention will be clear from the following detailed description of the preferred embodiments of the invention in conjunction with the accompanying drawings.

DESCRIPTION OF THE PREFERRED EMBODIMENTS

In the present invention, the switch connected to the hold capacitor comprises two switches that are connected in series with each other, and that are simultaneously turned on or off.

Hereinafter, the switches connected in series with each other are referred to as "series configuration switches".

Even though the switches used in the sample-and-hold circuit are thus constituted of two switches in series with each other, these switches can be used in the same manner as typical switches if they are simultaneously turned on or off.

Also, in the present invention, the potential difference between both ends of the switch (hereinafter, referred to as an input terminal side switch) connected to the input terminal of the above-described amplifier, out of the switches that constitutes the series configuration switches, is set to zero, at least during the time period that the switches are in the OFF state. In order to set the potential difference to be zero, there is provided an equipotential setting circuit that sets the potential of interconnection node of these switches that constitutes the series configuration switches. The equipotential setting circuit generates the same voltage as the input terminal voltage of the amplifier or the voltage close thereto, and applies them to the interconnection node of these switches.

Then, one end of the input terminal side switch is a potential of the input terminal. The other end of the input terminal side switch exhibits an equal voltage to that of the input terminal or the voltage close thereto by the equipotential setting circuit. As a result, the potential difference between both ends of the switch becomes zero or a small voltage.

The leakage currents flowing via the switch depends on the potential difference between both ends of the switch. In the present invention, since the potential difference between both ends of the switch becomes zero or a small voltage, the leakage current flowing via the switch becomes zero or a small current. In the case of the switch other than the input terminal side switch that constitutes the series configuration switches, leakage currents flow as in the case of the conventional examples. However, since these leakage currents are supplied by the equipotential setting circuit, there is no leakage of the charge stored in the hold capacitor. Hence, if such series configuration switches are used as switches to be connected to the hold capacitor, the charge leakage from the capacitor via the switches will be reduced.

Thus, in the present invention, the charge stored in the capacitor can be prevented from leaking as leakage currents via the switches connected to the capacitor. It is, therefore, possible to suppress a reduction in the held voltage due to the leakage of the charge stored in the capacitor, and to thereby improve the performance of the sample-and-hold circuit.

Figure 1:
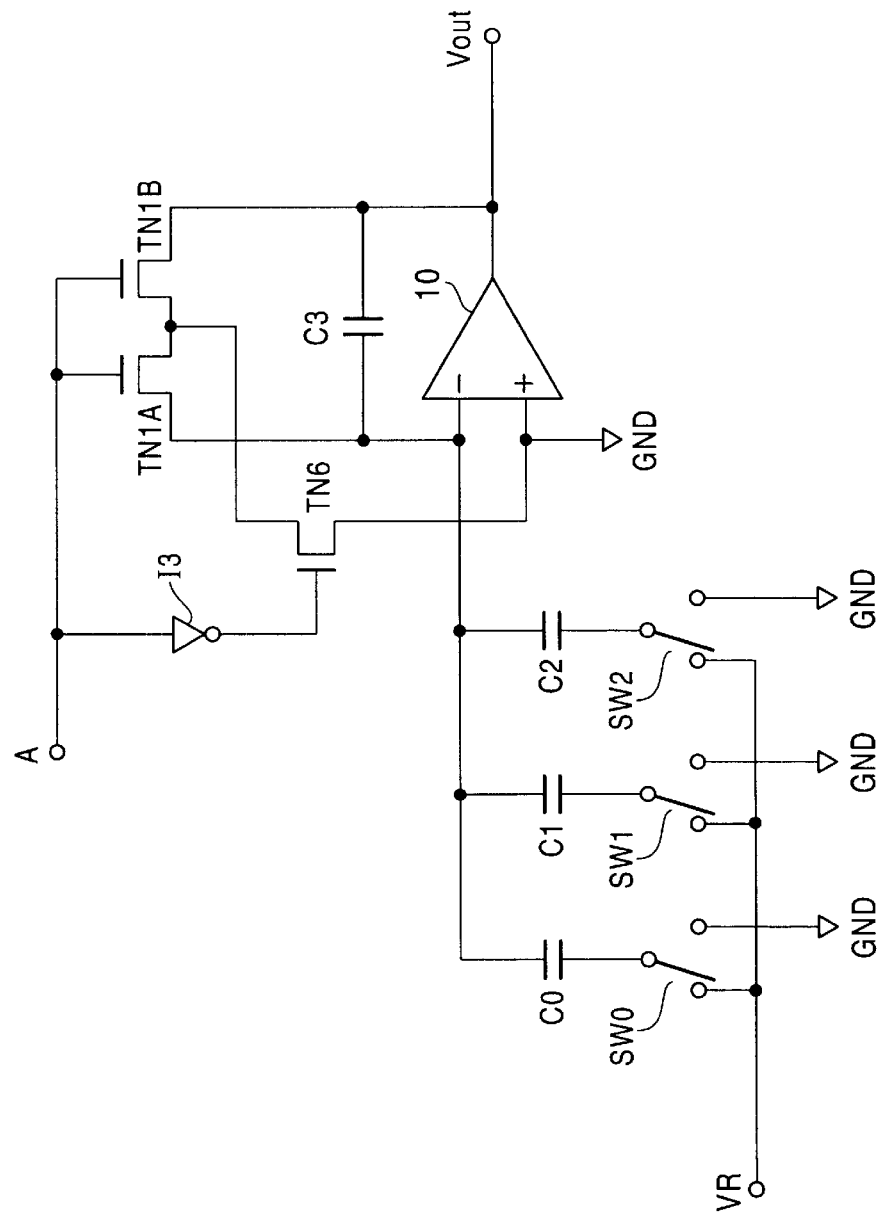
FIG. 1 is a circuit diagram for a capacitor array type D/A conversion circuit using a sample-and-hold circuit in accordance with a first embodiment to which the present invention is applied.

FIG. 1 is a circuit diagram for a capacitor array type D/A conversion circuit using a sample-and-hold circuit in accordance with a first embodiment to which the present invention is applied.

Figure 4:
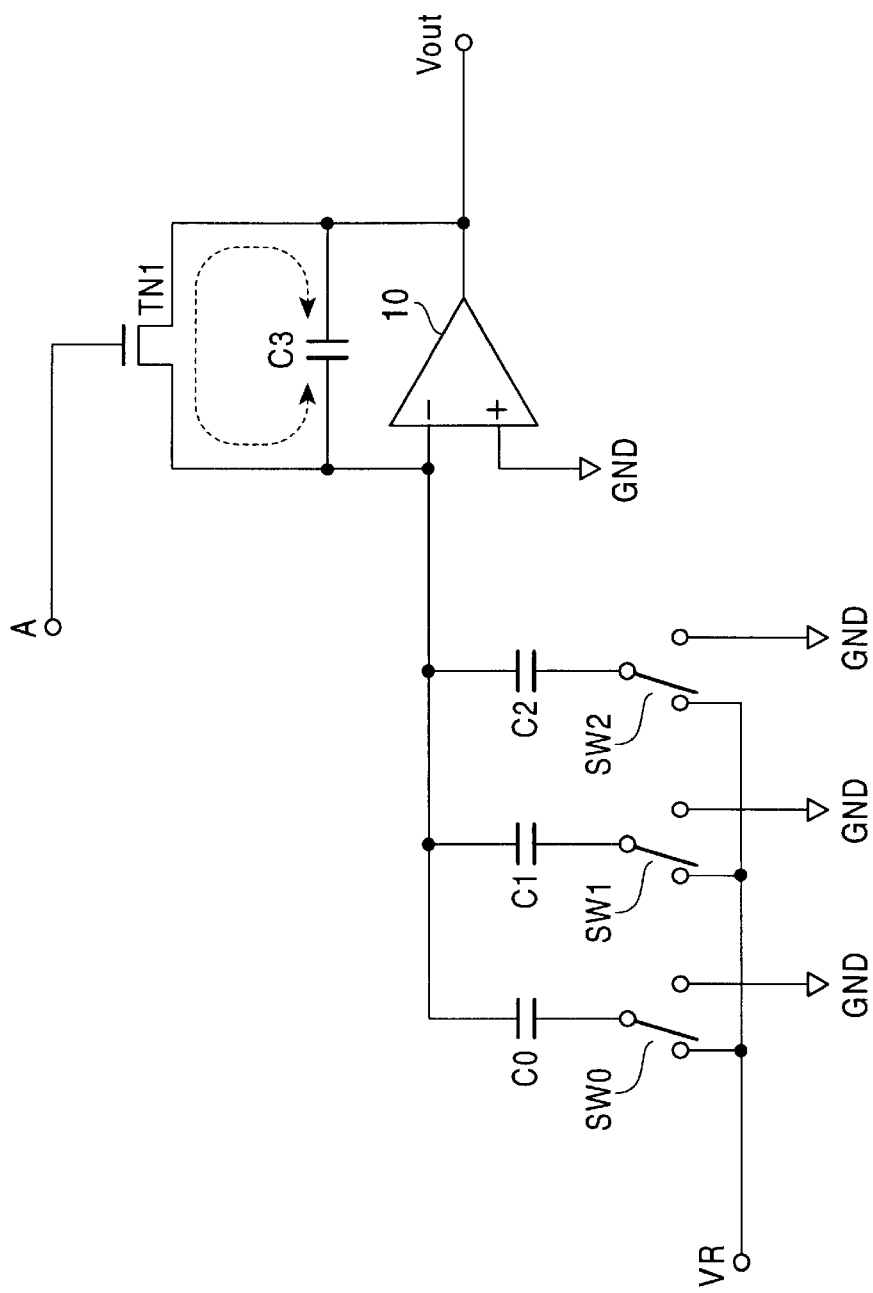
FIG. 4 is a circuit diagram for a capacitor array type D/A conversion circuit using a sample-and-hold circuit in accordance with a first conventional example.

In this embodiment, the N-channel MOS transistor TN1 in the conventional example shown in FIG. 4 is replaced with the series configuration switches that are constituted of N-channel MOS transistors TN1A and TN1B. In addition, this embodiment is provided with an equipotential setting circuit comprising a N-channel MOS transistor TN6 and an inverter I3.

An amplifier 10 is a differential amplifier, and outputs a voltage in proportion to the potential difference between the positive input terminal and negative input terminal to the output terminal. Since the amplifier 10 is constructed of a negative feedback circuit, the potential difference between the positive input terminal and negative input terminal thereof is significantly small. The relationship between the positive and negative input terminals, therefore, constitutes a state called "virtual short".

In this embodiment, during the time period that the series configuration switches are in the OFF state, an "H" level is output from the inverter I3, and a N-channel MOS transistor TN6 comes into the ON state. Consequently, the potential at the interconnection node between the two switches that constitute the series configuration switches becomes equal to that of the positive input terminal of the amplifier 10. Thereby, the potential at the interconnection node becomes substantially equal to the negative input terminal of the amplifier 10 due to the above-described virtual short. Thus, substantially equal potentials are applied to both ends of the N-channel MOS transistor TN1A.

In this way, in this embodiment, during the time period that the charge is held in the hold capacitor, the leakage currents flowing through the N-channel MOS transistor TN1A that constitutes the series configuration switches becomes substantially zero. On the other hand, in the other N-channel MOS transistor TN1B that constitutes the series configuration switches, since the currents flowing therethrough are supplied by a ground GND via the N-channel MOS transistor TN6 of the equipotential setting circuit, there is no leakage of the charge stored in the hold capacitor.

Thus, in this embodiment, the charge stored in the capacitor can be prevented from leaking as leakage currents via the switches connected to the capacitor. It is, therefore, possible to suppress a reduction in the held voltage due to the leakage of the charge stored in the capacitor, and to thereby improve the performance of the sample-and-hold circuit, for example, to increase the conversion accuracy in the capacitor array type D/A conversion circuit thereof.

Figure 2:
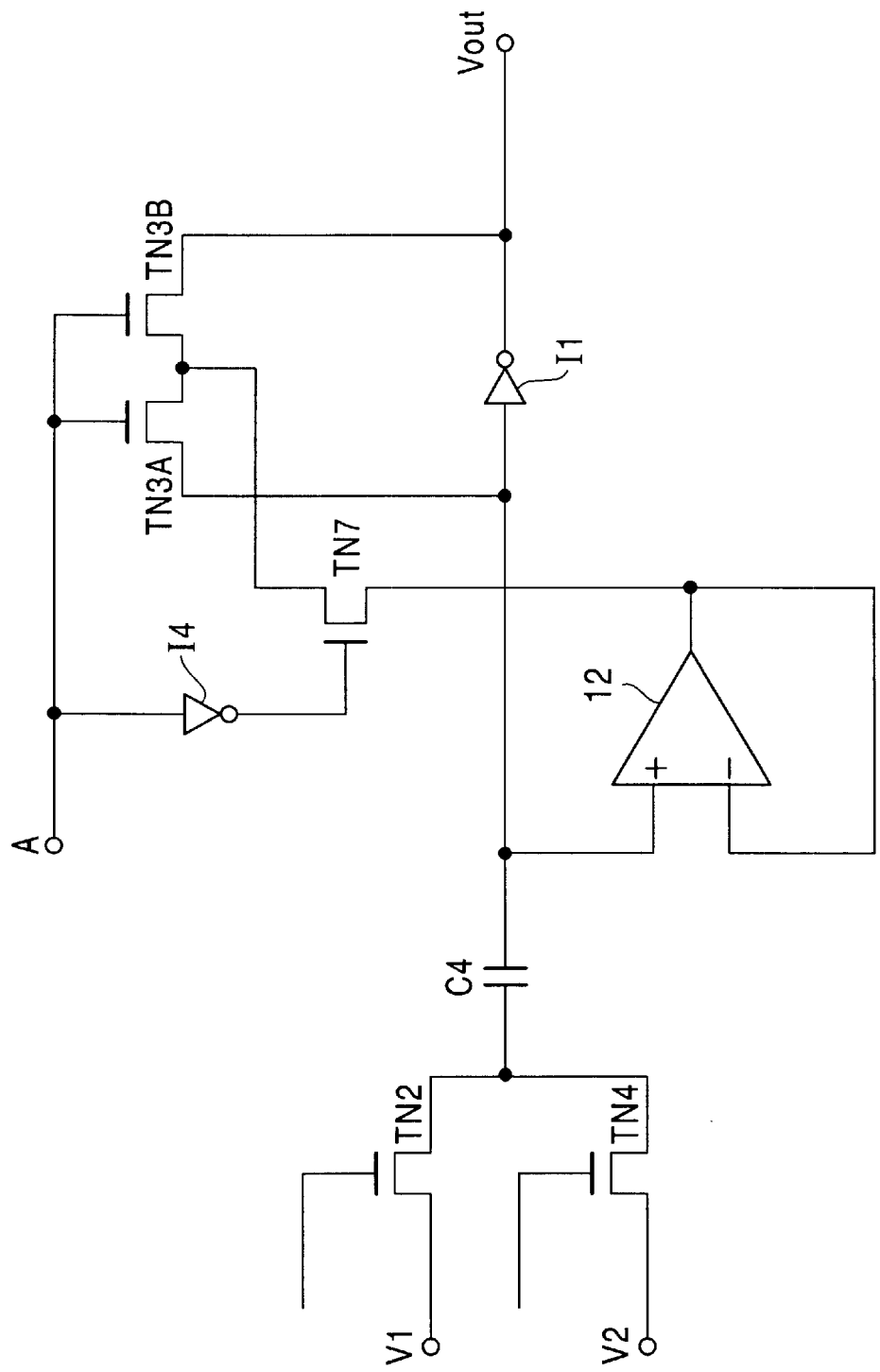
FIG. 2 is a circuit diagram for a switching comparator using a sample-and-hold circuit in accordance with a second embodiment to which the present invention is applied.

FIG. 2 is a circuit diagram for a switching comparator using a sample-and-hold circuit in accordance with a second embodiment of the present invention.

Figure 5:
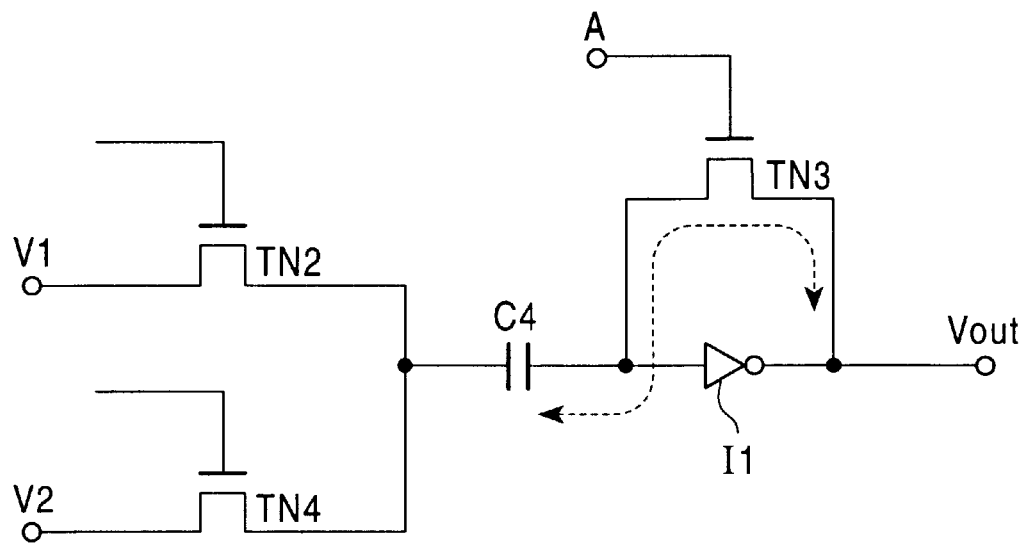
FIG. 5 is a circuit diagram for a switching comparator using a sample-and-hold circuit in accordance with a second conventional example.
Figure 6:
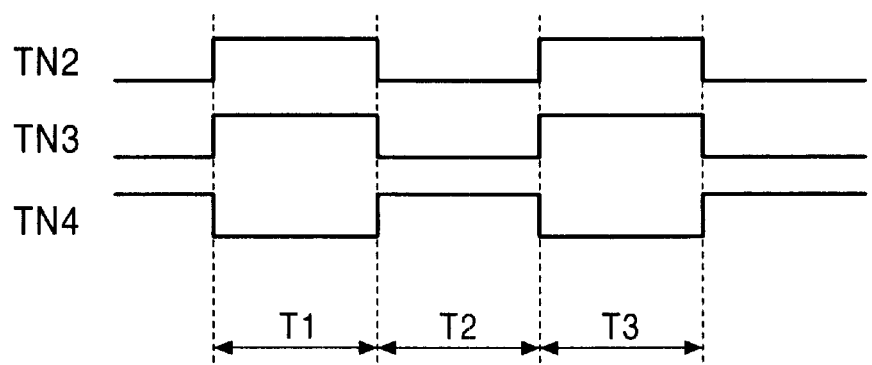
FIG. 6 is a time chart showing the operations of the switching comparator shown in FIG. 5.

The N-channel MOS transistor TN3 in the conventional example shown in FIG. 5 is a switch that stores charge in a capacitor C4 and holds the charge. The stored charge leaks as leakage currents via this switch.

In this embodiment, this N-channel MOS transistor TN3 in the conventional example is replaced with the series configuration switches that are constituted of N-channel MOS transistors TN3A and TN3B. In addition, this embodiment is provided with an equipotential setting circuit comprising a N-channel MOS transistor TN7 and an inverter I4.

An amplifier 12 is a differential amplifier. The amplifier amplifies the potential difference between the positive input terminal and negative input terminal thereof, and outputs the amplified voltage to the output terminal thereof. Since the amplifier 12 is constructed of a negative feedback circuit, and constitutes a buffer amplifier of which the amplification factor is "1", the potential difference between the positive input terminal and negative input terminal thereof is significantly small. The relationship between the positive and negative input terminals, therefore, constitutes a state called "virtual short", as described above.

In this embodiment, during the time period that the series configuration switches are in the OFF state, an "H" level is output from the inverter I4, and a N-channel MOS transistor TN7 comes in the ON state. Consequently, the potential at the interconnection node between the two switches constituting the series configuration switches becomes equal to that of the negative input terminal of the amplifier 12. Thereby, the potential at the interconnection node becomes substantially equal to that of the positive input terminal of the amplifier 12 due to the above-described virtual short. Thus, substantially equal potentials are applied to both ends of the N-channel MOS transistor TN3A.

In this manner, in this embodiment, during the time period that the charge is held in the hold capacitor, the leakage currents flowing through the N-channel MOS transistor TN3A that constitutes the series configuration switches becomes substantially zero. On the other hand, in the other N-channel MOS transistor TN3B that constitutes the series configuration switches, since currents flowing therethrough are supplied by the amplifier 12 of the equipotential setting circuit, there is no leakage of the charge stored in the hold capacitor.

Thus, in this embodiment, the charge stored in the capacitor can be prevented from leaking as leakage currents via the switches connected to the capacitor. It is, therefore, possible to suppress a reduction in the held voltage due to the leakage of charge stored in the capacitor, and to thereby improve the performance of the sample-and-hold circuit.

Figure 7:
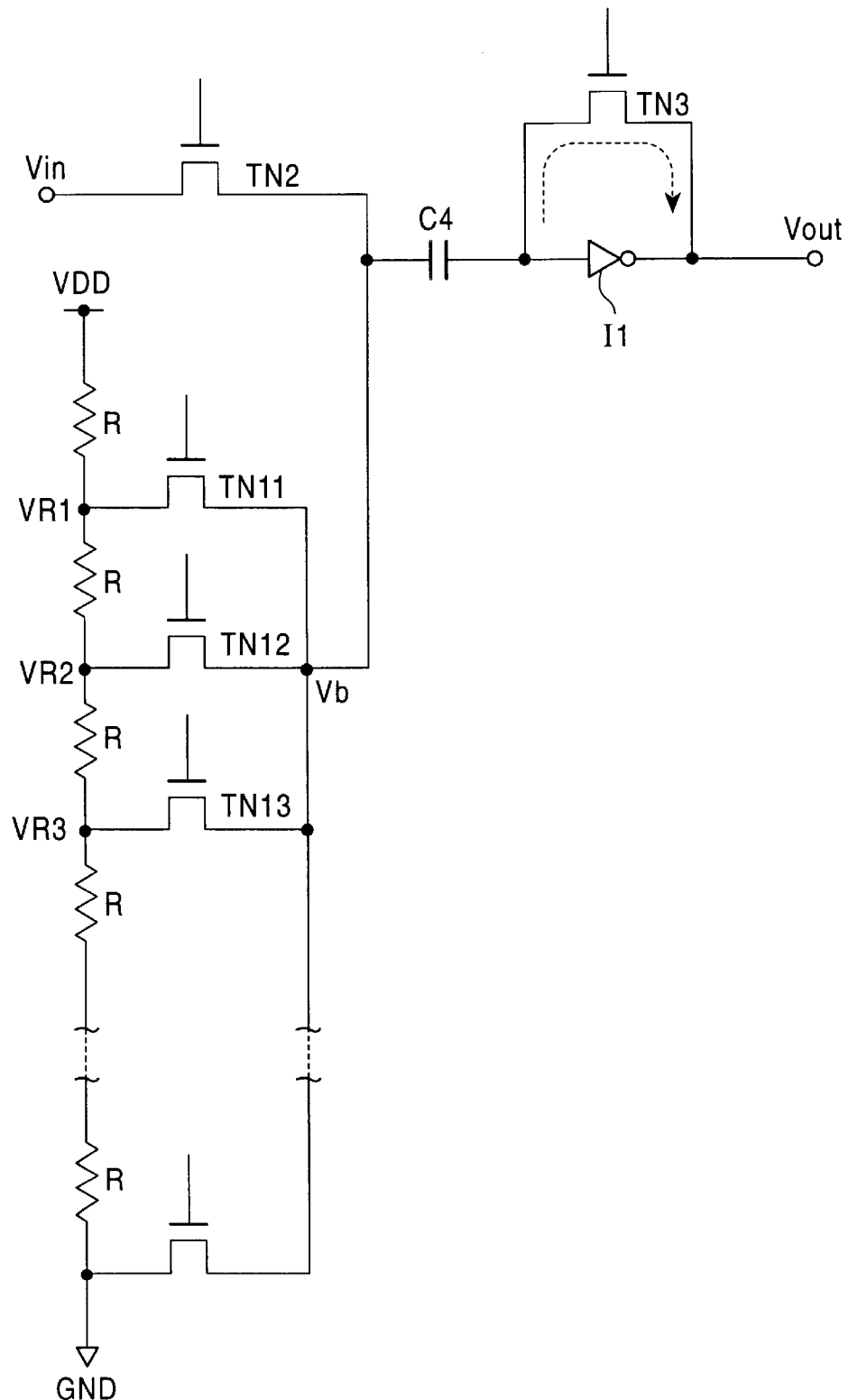
FIG. 7 is a circuit diagram for a successive comparison A/D conversion circuit using a switching comparator in accordance with a second conventional example.
Figure 8:
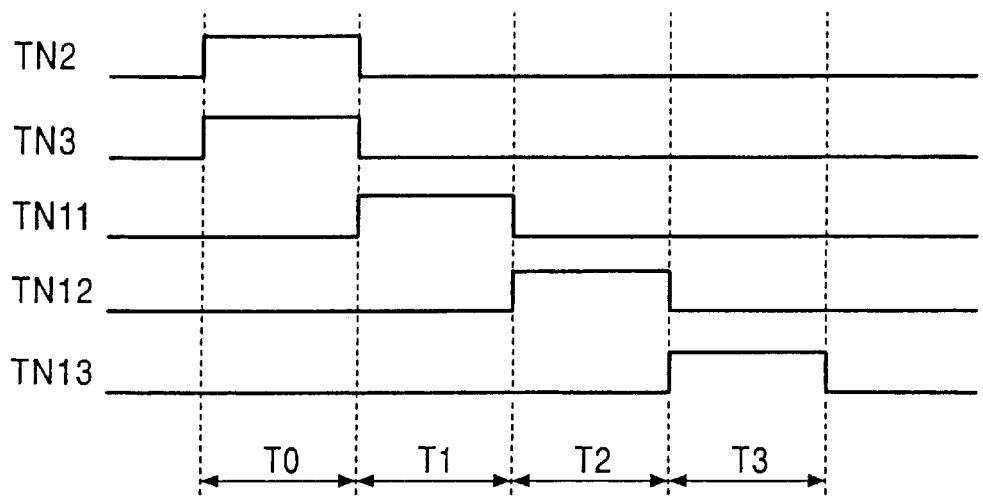
FIG. 8 is a time chart illustrating the operations of the A/D conversion circuit shown in FIG. 7.

Meanwhile, this second embodiment may be used instead of the sample-and-hold circuit that constitutes the successive comparison A/D conversion circuit in FIG. 7, this sample-and-hold circuit described as a conventional example.

Figure 3:
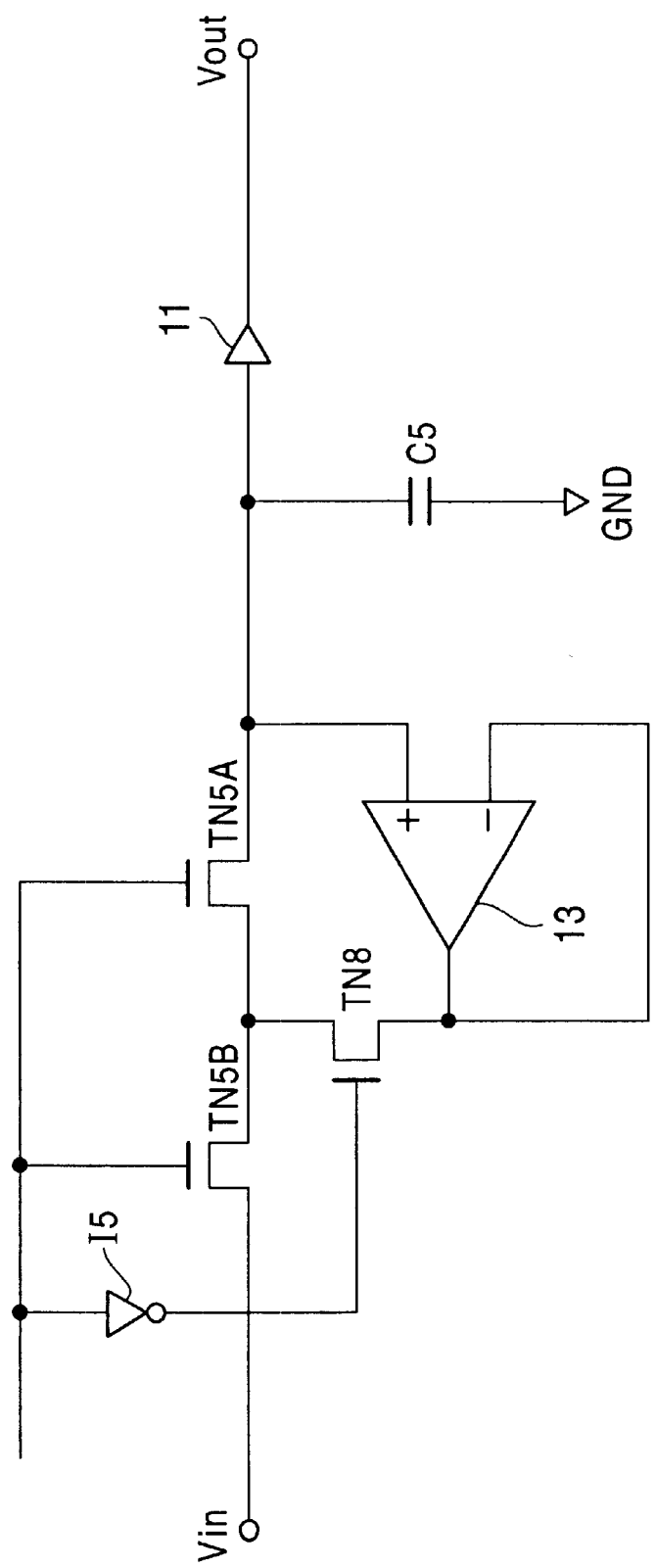
FIG. 3 is a circuit diagram for a sample-and-hold circuit in accordance with a third embodiment to which the present invention is applied.

FIG. 3 is a circuit diagram for a sample-and-hold circuit in accordance with a third embodiment of the present invention.

Figure 9:
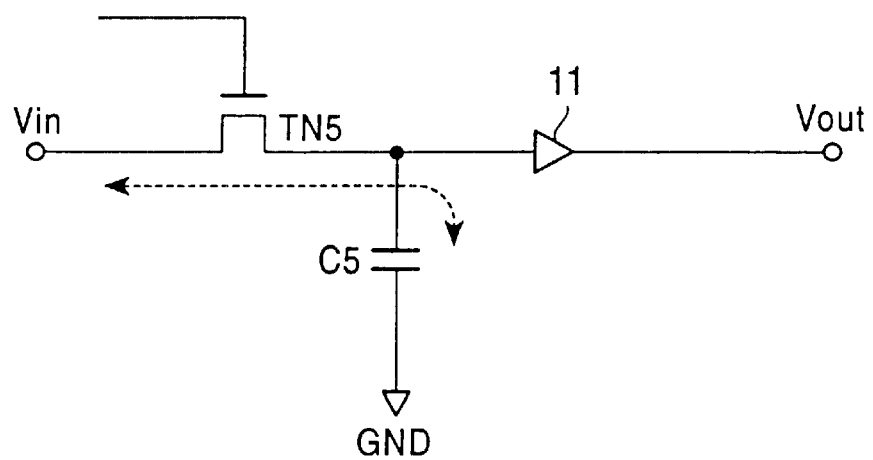
FIG. 9 is a circuit diagram for a sample-and-hold circuit in accordance with a third conventional example.
Figure 10:
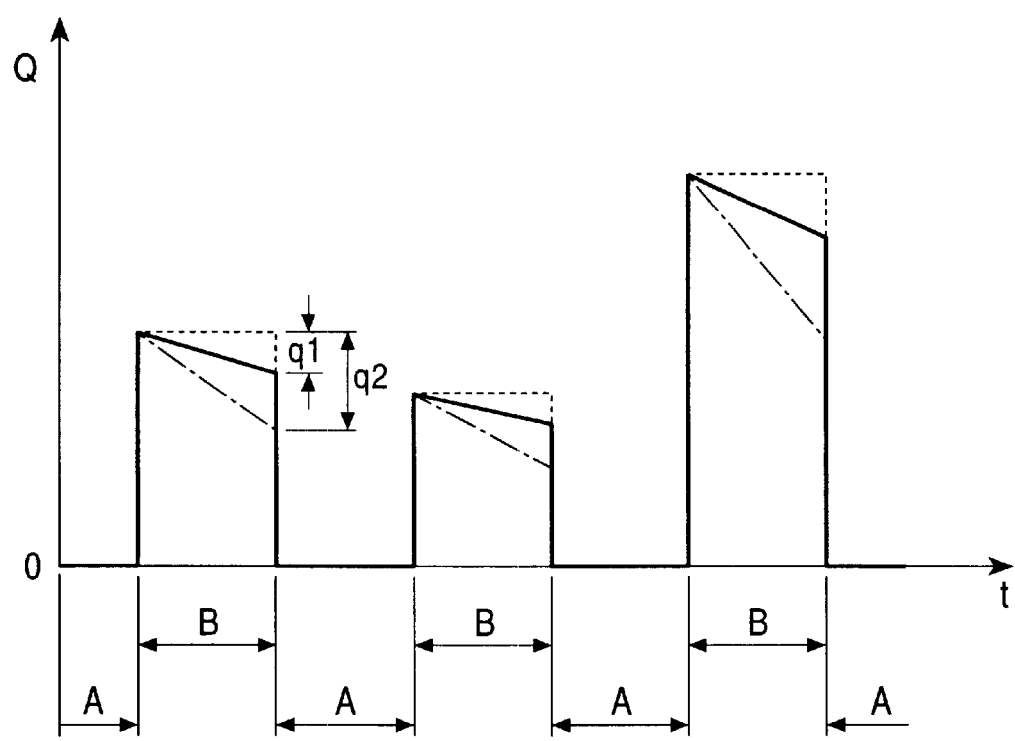
FIG. 10 is a diagram illustrating the leakage of the charge stored in the hold capacitor in the first conventional example.

The N-channel MOS transistor TN5 in the conventional example shown in FIG. 9 is a switch that stores charge in a capacitor C5 and which holds the charge. The stored charge leaks as leakage currents via this switch.

In this embodiment, this N-channel MOS transistor TN5 in the conventional example is replaced with the series configuration switches constituted of N-channel MOS transistors TN5A and TN5B. In addition, this embodiment is provided with an equipotential setting circuit comprising a N-channel MOS transistor TN8 and an inverter I5.

An amplifier 13 is a differential amplifier. The amplifier 13 amplifies the potential difference between the positive input terminal and negative input terminal thereof, and outputs the amplified voltage to the output terminal thereof. Since the amplifier 13 is constructed of a negative feedback circuit, and constitutes a buffer amplifier of which the amplification factor is "1", the potential difference between the positive input terminal and negative input terminal thereof is significantly small. The relationship between the positive and negative input terminals, therefore, constitutes a state called "virtual short", as described above.

In this embodiment, during the time period that the series configuration switches are in the OFF state, an "H" level is output from the inverter I5, and a N-channel MOS transistor TN8 comes into the ON state. Consequently, the potential at the interconnection node between the two switches constituting the series configuration switches becomes equal to that of the negative input terminal of the amplifier 13, and also becomes substantially equal to the positive input terminal of the amplifier 13 due to the above-described virtual short.

Thus, in this embodiment, during the time period that the charge is held in the hold capacitor, the leakage currents flowing through the N-channel MOS transistor TN5A that constitutes the series configuration switches becomes substantially zero. On the other hand, in the other N-channel MOS transistor TN5B that constitutes the series configuration switches, since currents flowing therethrough are supplied by the amplifier 13 of the equipotential setting circuit, there is no leakage of the charge stored in the hold capacitor.

In this way, in this embodiment, the charge stored in the capacitor can be prevented from leaking as leakage currents via the switches connected to the capacitor. It is, therefore, possible to suppress a reduction in the held voltage due to the leakage of charge stored in the capacitor, and to thereby improve the performance of the sample-and-hold circuit.

As is evident from the foregoing, in accordance with the present invention, the reduction in the held voltage due to the leakage of the charge stored in the capacitor can be suppressed, and thereby an improvement in the performance of the sample-and-hold circuit can be achieved. Moreover, the elongation of the time period that charge can be held, allows operations at lower speed, and eliminates the need for frequent refresh operations, and leads to reduced power consumption.

While the present invention has been described with reference to what are at present considered to be the preferred embodiments, it is to be understood that various changes and modifications may be made thereto without departing from the invention in its broader aspects and therefore, it is intended that the appended claims cover all such changes and modifications as fall within the true spirit and scope of the invention.

What is claimed is:

1. A sample-and-hold circuit, comprising:
   a capacitor, having first and second ends, for storing a voltage input from an outside source as an electric charge and holding a potential thereof; and switches connected to said capacitor, said switches being constituted of a plurality of switches that are connected in series with each other, said plurality of switches being simultaneously turned on or off, wherein a potential difference between both ends of a first switch that is one out of the plurality of switches and is connected to one of first and second ends of said capacitor, is set to zero or substantially zero, at least during a time period that said plurality of switches is in the OFF state.

2. A sample-and-hold circuit in accordance with claim 1, wherein said first switch is connected to a charge storage electrode, which is one of the first and second ends of said capacitor.

3. A sample-and-hold circuit in accordance with claim 1, further comprising:

an equipotential setting circuit that sets the potential of one end of said first switch wherein another end thereof is connected to said capacitor so that the potential difference between both ends of said first switch becomes zero or substantially zero.

4. A sample-and-hold circuit in accordance with claim 2, further comprising:

an equipotential setting circuit that sets the potential of one end of said first switch wherein another end thereof is connected to said capacitor so that the potential difference between both ends of said first switch becomes zero or substantially zero.

5. A sample-and-hold circuit in accordance with claim 1, wherein each of said plurality of switches or said capacitor is formed of a MOS transistor.

6. A sample-and-hold circuit in accordance with claim 2, wherein each of said plurality of switches or said capacitor is formed of a MOS transistor.

7. A sample-and-hold circuit in accordance with claim 3, wherein said equipotential setting circuit comprising:

a differential amplifier having a first input terminal, a second input terminal, and an output terminal for outputting a voltage obtained by amplifying the potential difference between said first and second input terminals; and a second switch for connecting an interconnection node of said plurality of switches and said first input terminal, wherein the first end of said capacitor is connected to said second input terminal, the second end thereof is connected to said output terminal, and the interconnection node of said plurality of switches and said first input terminal are connected by said second switch, during the time period that said plurality of switches is in the OFF state.

8. A sample-and-hold circuit in accordance with claim 4, wherein said equipotential setting circuit comprising:

a differential amplifier having a first input terminal, a second input terminal, and an output terminal for outputting a voltage obtained by amplifying a potential difference between said first and second input terminals; and a second switch for connecting an interconnection node of said plurality of switches and said first input terminal, wherein the first end of said capacitor is connected to said second input terminal, the second end thereof is connected to said output terminal, and the interconnection node of said plurality of switches and said first input terminal are connected by said second switch, during the time period that said plurality of switches is in the OFF state.

9. A sample-and-hold circuit in accordance with claim 3, wherein said equipotential setting circuit comprises:

a buffer amplifier that amplifies a voltage at an interconnection node between one of the ends of said capacitor and an input terminal of said buffer amplifier, outputs the amplified voltage to an output terminal thereof, and has an amplification factor of "1"; and a switch that connects an interconnection node of said plurality of switches and the output terminal of said buffer amplifier, during the time period that said plurality of switches is in the OFF state.

10. A sample-and-hold circuit in accordance with claim 4, wherein said equipotential setting circuit further comprises:

a buffer amplifier that amplifies a voltage at an interconnection node between one of the ends of said capacitor and an input terminal of said buffer amplifier, outputs the amplified voltage to an output terminal thereof, and has an amplification factor of "1"; and a switch that connects an interconnection node of said plurality of switches and the output terminal of said buffer amplifier, during the time period that said plurality of switches is in the OFF state.

* * * * *